US008401407B2

(12) United States Patent
Hamaya

(10) Patent No.: US 8,401,407 B2
(45) Date of Patent: Mar. 19, 2013

(54) IMAGE FORMING APPARATUS AND METHOD FOR TESTING CONNECTION OF A VOLTAGE LINE FOR APPLYING VOLTAGE TO THE IMAGE FORMING APPARATUS

(75) Inventor: Masahito Hamaya, Nagoya (JP)

(73) Assignee: Brother Kogyo Kabushiki Kaisha, Nagoya-shi, Aichi (JP)

( * ) Notice: Subject to any disclaimer, the term of this patent is extended or adjusted under 35 U.S.C. 154(b) by 268 days.

(21) Appl. No.: 12/844,910

(22) Filed: Jul. 28, 2010

(65) Prior Publication Data

US 2011/0026949 A1    Feb. 3, 2011

(30) Foreign Application Priority Data

Jul. 31, 2009   (JP) ................................. 2009-179757

(51) Int. Cl.
 *G03G 21/00* (2006.01)
(52) U.S. Cl. ........................................................ 399/37
(58) Field of Classification Search .................... 399/37, 399/9, 88, 89
See application file for complete search history.

(56) References Cited

U.S. PATENT DOCUMENTS

| 2008/0056740 A1* | 3/2008 | Inukai ............................ 399/37 |
| 2008/0143339 A1 | 6/2008 | Iseki |

FOREIGN PATENT DOCUMENTS

| JP | 2001-165986 A | 6/2001 |
| JP | 2002-040105 A | 2/2002 |
| JP | 2005-323107 | 11/2005 |
| JP | 2008-058481 | 3/2008 |
| JP | 2008-151715 | 7/2008 |

OTHER PUBLICATIONS

Notification of Reasons for Refusal dispatched Mar. 31, 2011 in Japanese Application No. 2009-179757 and English translation thereof.

* cited by examiner

*Primary Examiner* — Quana M Grainger
(74) *Attorney, Agent, or Firm* — Banner & Witcoff, Ltd.

(57) ABSTRACT

An image forming apparatus includes: an attachment unit configured to receive at least one voltage and being replaceable with a test tool, a controller for controlling operation of a plurality of voltage generating circuits, a current detecting section and a deciding section. The controller is configured to control a first voltage generating circuit so as to generate a test voltage and so as to apply the test voltage through a first voltage line, the test tool, and a second voltage line to a second voltage generating circuit. The deciding section is configured to, upon a detection current corresponding to the applied test voltage and detected by the current detecting section being equal to or greater than a first predetermined value, decide that the predetermined voltages are to be normally applied through the respective first and second voltage lines to the attachment unit.

13 Claims, 5 Drawing Sheets

IMAGE FORMING APPARATUS AND METHOD FOR TESTING CONNECTION OF A VOLTAGE LINE FOR APPLYING VOLTAGE TO THE IMAGE FORMING APPARATUS

CROSS REFERENCE TO RELATED APPLICATION

This application claims priority from Japanese Patent Application No. 2009-179757 filed on Jul. 31, 2009. The entire content of this priority application is incorporated herein by reference.

TECHNICAL FIELD

The present invention relates to an image forming apparatus or, specifically, to a method for testing connection of a voltage line for applying a voltage to an electric load of the image forming apparatus.

BACKGROUND

There is a known method for testing a voltage to be applied to an electric load (such as an image forming unit) in an image forming apparatus. Specifically, the method is employed to determine whether the voltage is to be applied from a voltage line to the image forming unit is normal. With the method, while the voltage line is tested, a load having a lower resistance than the resistance of the image forming unit is used so that the connection between a high-voltage power source and the electric load is efficiently ascertained.

However, though the voltage line can be efficiently tested with the method, the configuration for determining pass/fail is rather complex.

Therefore, there is a need for a method for easily testing the voltage line connection of the image forming apparatus.

SUMMARY

An aspect of the present invention is an image forming apparatus including: an attachment unit configured to receive at least one voltage; a holder configured to allow the attachment unit to be removably attached thereto, the attachment unit being replaceable with a test tool; a plurality of voltage generating circuits, each of the voltage generating circuits being configured to generate a predetermined voltage and to apply the predetermined voltage through a corresponding voltage line to the attachment unit attached to the holder; a controller for controlling operation of the plurality of voltage generating circuits, the controller being configured to control a first voltage generating circuit so as to generate a test voltage and so as to apply the test voltage through a first voltage line, the test tool, and a second voltage line to a second voltage generating circuit, the first voltage generating circuit being one of the plurality of voltage generating circuits, the first voltage line corresponding to the first voltage generating circuit, the second voltage generating circuit being different from the first voltage generating circuit, the second voltage line corresponding to the second voltage generating circuit; a current detecting section provided in at least one of the first and second voltage generating circuits, the current detecting section being configured to detect a current flowing through the attachment unit due to the applied predetermined voltage; and a deciding section configured to, upon the detection current corresponding to the applied test voltage and detected by the current detecting section being equal to or greater than a first predetermined value, decide that the predetermined voltages are to be normally applied through the respective first and second voltage lines to the attachment unit.

Another aspect of the present invention is a method for testing an image forming apparatus. The image forming apparatus includes: a holder configured to allow an attachment unit to be removably attached thereto, the attachment unit being configured to receive at least one voltage, the attachment unit being replaceable with a test tool; and a plurality of voltage generating circuits, each of the voltage generating circuits being configured to generate a predetermined voltage and to apply the predetermined voltage through a corresponding voltage line to the attachment unit attached to the holder. The method being for testing whether the voltages are to be normally applied through the voltage lines to the attachment unit. The method comprising the steps of: a) attaching the test tool to the holder; b) generating a test voltage using a first voltage generating circuit, the first voltage generating circuit being one of the plurality of voltage generating circuits; c) applying the test voltage through a first voltage line, the test tool, and a second voltage line to a second voltage generating circuit, the first voltage line corresponding to the first voltage generating circuit, the second voltage generating circuit being different from the first voltage generating circuit, the second voltage line corresponding to the second voltage generating circuit; d) detecting a current due to the applied test voltage using a current detecting section provided in at least one of the first and second voltage generating circuits; e) determining whether the detection current detected in the step d) is equal to or greater than a first predetermined value; and f) upon determination that the detection current is greater than the first predetermined value in the step e), deciding that the predetermined voltages are to be normally applied through the first and second voltage lines to the attachment unit.

DETAILED DESCRIPTION

<Illustrative Aspect>

Figure 1:
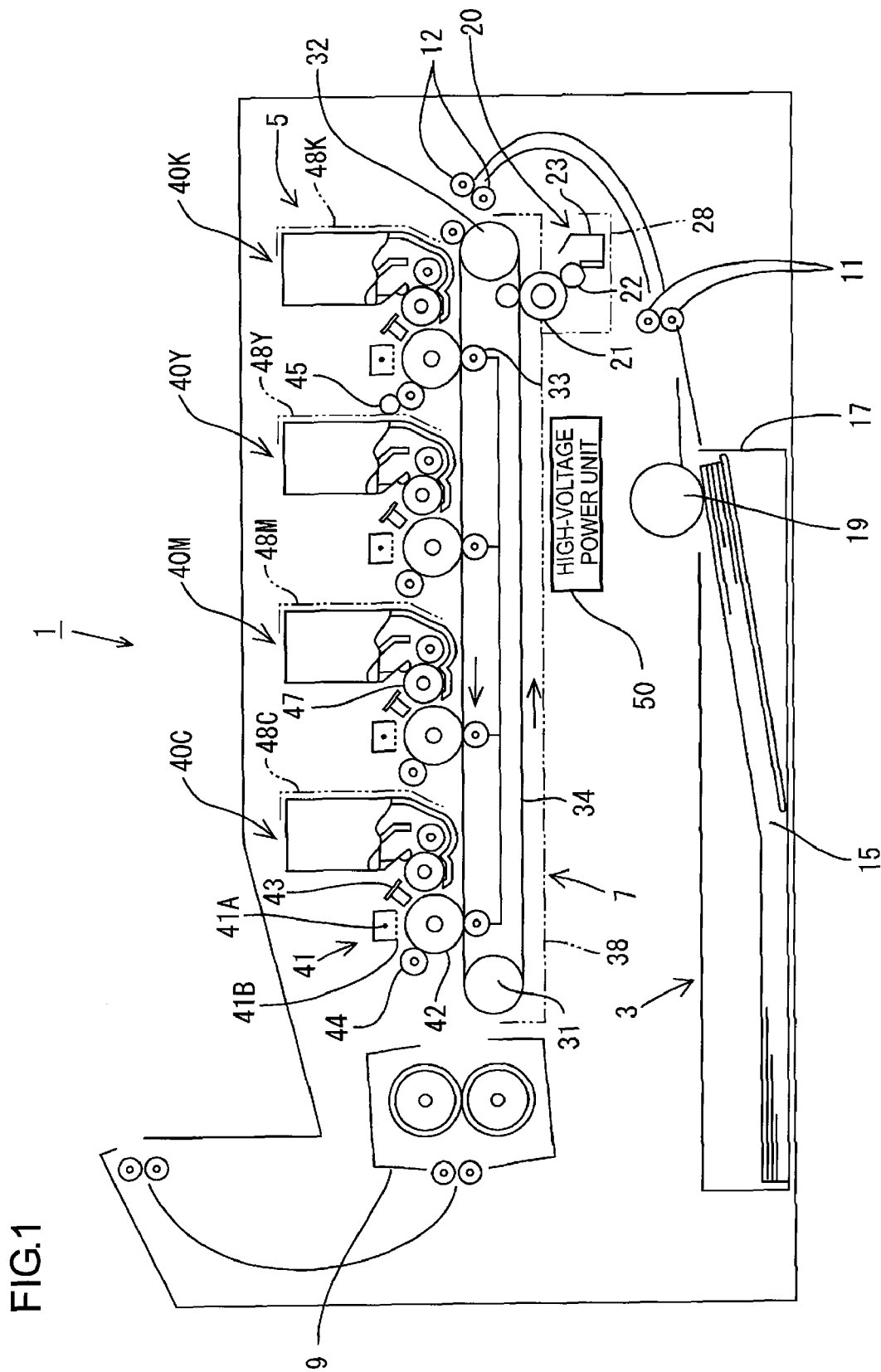
FIG. 1 is a schematic sectional view illustrating an inner configuration of a printer of an illustrative aspect of the present invention.

An illustrative aspect in accordance with the present invention will be described with reference to FIGS. 1 through 5.

1. Schematic Configuration of Printer

First, an illustrative schematic configuration of a printer will be described. Components when being distinguished by their colors will be designated with reference characters with respective additional characters (Y (yellow), M (magenta), C (cyan), and K (black)). When the components are not distinguished by their colors, the additional characters will be omitted.

As illustrated in FIG. 1, a printer 1 (an image forming apparatus) includes a sheet supply unit 3, an image forming unit 5, a conveying mechanism 7, a fixing unit 9, a belt cleaning mechanism 20, and a high-voltage power unit 50. The printer 1 forms a toner image on a sheet 15 (a paper sheet, an OHP sheet, etc.) with a single or a plurality of color toners in accordance with an image data input from, for example, an external device. In this illustrative aspect, four colors (yellow, magenta, cyan and black) of toner are used for the toner-image formation.

The sheet supply unit 3 is disposed in the bottom area within the printer 1. The sheet supply unit 3 includes a tray 17 and a pickup roller 19. The tray 17 holds the sheets 15 therein. The sheets 15 in the tray 17 are picked up one by one by the pickup roller 19 and then are sent through conveying rollers 11 and registration rollers 12 to the conveying mechanism 7.

The conveying mechanism 7 (a second attachment unit) can convey the sheets 15. The conveying mechanism 7 is removably attached to a predetermined holder 38. The conveying mechanism 7 includes a driving roller 31, a driven roller 32, and a belt 34. The belt 34 is looped around the driving roller 31 and the driven roller 32. The belt 34 has a surface opposed to photosensitive drums 42. As the driving roller 31 rotates, the surface of the belt 34 moves from right to left in FIG. 1. Thus, the sheet 15 sent from the registration rollers 12 is conveyed to the area under the image forming unit 5. The conveying mechanism 7 also includes four transfer rollers 33.

The image forming unit 5 includes four process units 40Y, 40M, 40C, 40K (each is a first attachment unit) and four exposure sections 43. Each process unit 40 includes a charger 41, the photosensitive drum 42 (a photosensitive body), a drum cleaning mechanism 44, 45, a unit case 46, and a developing roller 47. The process units 40Y, 40M, 40C, 40K are removably attached to predetermined holders 48Y, 48M, 48C, 48K in the printer 1 respectively.

Each photosensitive drum 42 illustratively has an aluminium base and a positively chargeable photosensitive layer on the base. The aluminium base is connected to a ground line of the printer 1. The charger 41 is illustratively a charger of a scorotron type, having a charging wire 41A and a grid 41B. A charging voltage CHG is applied to the charging wire 41A, while a grid voltage GRID in the grid 41B is controlled so that the surface of the photosensitive drum 42 has a substantially uniform potential (e.g. +700 V).

Each exposure section 43 illustratively has a plurality of light-emitting elements (e.g. LEDs) arranged in line along the axial direction of the photosensitive drum 42. The exposure section 43 controls light emission of the light-emitting elements in accordance with the image data input from the external device. An electrostatic latent image is thus formed on the surface of the photosensitive drum 42. Note that the exposure section 43 is secured in the printer 1. The exposure section 43 may be a laser section.

Each unit case 46, which stores color toner, has a developing body (for example, the developing roller 47). In this illustrative aspect, the toner is positively chargeable nonmagnetic single-component toner. The developing roller 47 charges the toner to "+" (positively) and then supplies the charged toner onto the photosensitive drum 42 to form a uniform thin toner layer. Thus, the electrostatic latent image is developed into a toner image.

Each transfer roller 33 is disposed in a position to cooperate with the photosensitive drum 42 to hold the belt 34 therebetween. A transfer voltage TRCC is applied to the transfer roller 33, and thus the toner image on the photosensitive drum 42 is transferred onto the sheet 15. The transfer voltage TRCC has a polarity opposite to the charged polarity of the toner. In this illustrative aspect, the transfer voltage TRCC has a negative polarity. Thereafter, the conveying mechanism 7 conveys the sheet 15 to the fixing unit 9. The fixing unit 9 fuses the toner image on the sheet 15. Finally, the sheet 15 is outputted onto a top face of the printer 1.

Each drum cleaning mechanism 44, 45 is a cleaning mechanism that electrostatically adsorbs and removes wastes (toner, paper powder, etc.) on the photosensitive drum 42. The drum cleaning mechanism 44, 45 includes a drum cleaning roller 44 (a photosensitive-body cleaner), a paper-powder collection roller 45, and a paper-powder collection box (not illustrated in the drawings).

The drum cleaning mechanism 44, 45 has two operation modes, i.e. a mode for removing the toner, which has the positive polarity, and a mode for removing the paper powder, which has the negative polarity. The two modes include: a toner removal mode executed at a time of printing; and a paper-powder removal mode executed after termination of a printing job and after printing of a predetermined number of sheets. Note that, out of the four process units 40, the process unit 40K alone has the paper-powder collection roller 45.

The belt cleaning mechanism 20 (the attachment unit) is disposed below the conveying mechanism 7. The belt cleaning mechanism 20 is removably attached to a predetermined holder 28. The belt cleaning mechanism 20 includes a belt cleaning roller 21, a waste collection roller 22, and a collection box 23. The belt cleaning mechanism 20 collects wastes (mainly residual toner) on the belt 34.

2. Configuration of High-Voltage Power Unit

Figure 2:
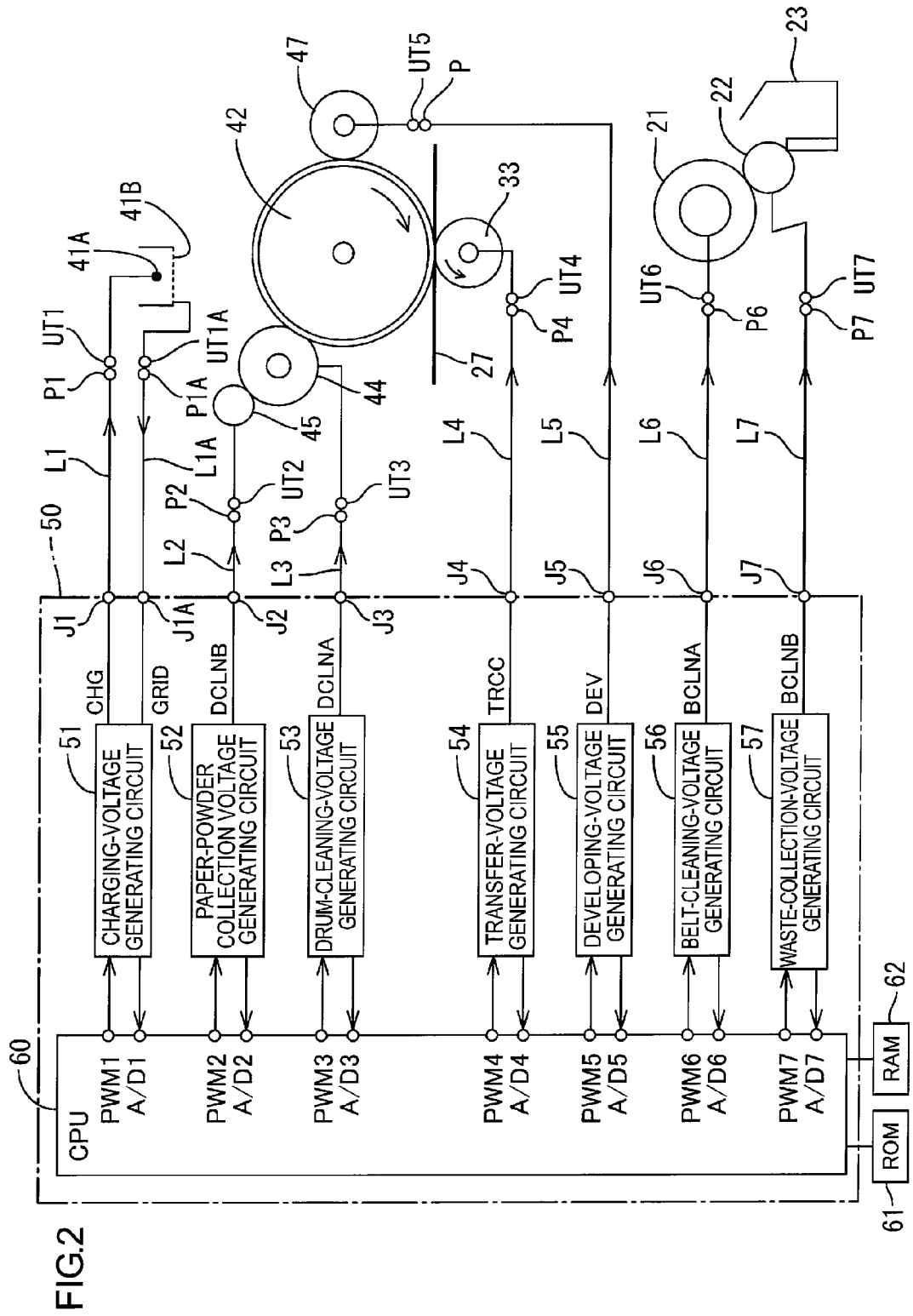
FIG. 2 is a schematic block diagram of a high-voltage power unit of the printer.

Next, a schematic electrical configuration of the printer 1 will be described. FIG. 2 is an illustration of a schematic diagram of the high-voltage power unit 50 mounted to a circuit board (not illustrated in the drawings) and a wiring diagram related to the high-voltage power unit 50. The high-voltage power unit 50 includes voltage generating circuits corresponding to the process units 40Y, 40M, 40C, 40K respectively. Since the voltage generating circuits are substantially identical with each other in the configuration related to the respective process units, only the voltage generating circuit which is related to the process unit 40K is illustrated in FIG. 2.

The high-voltage power unit 50 includes a CPU 60 (a controller and a deciding section), a plurality of voltage generating circuits connected to the CPU 60, a ROM 61, and a RAM 62. The CPU 60 controls the overall operation of the printer. The ROM 61 stores operation programs etc. for the control of the overall operation of the printer. The RAM 62 stores the image data etc. that are used in the printing process.

As illustrated in FIG. 2, the voltage generating circuits illustratively include a charging-voltage generating circuit 51, a paper-powder collection voltage generating circuit 52, a drum-cleaning-voltage generating circuit 53, a transfer-voltage generating circuit 54, a developing-voltage generating circuit 55, a belt-cleaning-voltage generating circuit 56, and a waste-collection-voltage generating circuit 57. Note that the configuration of the voltage generating circuits is not limited to this.

The charging-voltage generating circuit 51 generates: the charging voltage CHG to be applied to the charging wire 41A of the charger 41; and the grid voltage GRID to be applied to the grid 41B. The charging voltage CHG is illustratively from 5.5 kV to 8 kV (positive). The grid voltage GRID is illustratively approximately 700 V (positive). In this illustrative aspect, the grid voltage GRID is generated by dividing the charging voltage CHG using: a discharging resistor at the time of discharge between the charging wire 41A and the grid 41B; and a voltage dividing resistor in the charging-voltage generating circuit 51 (see FIG. 5).

The charging-voltage generating circuit 51 generates the charging voltage CHG in accordance with a PWM (pulse-width modulation) signal from a PWM port PWM1 of the CPU 60. The charging voltage CHG is then applied through a circuit-board terminal J1, a voltage line L1, a holder terminal P1, and a unit terminal UT1 to the charging wire 41A. At the same time, based on the charging voltage CHG, the grid voltage GRID is applied to the grid 41B.

The paper-powder collection voltage generating circuit 52 generates a paper-powder collection voltage DCLNB to be applied to the paper-powder collection roller 45. The paper-powder collection voltage DCLNB in the paper-powder removal mode is illustratively approximately 700 V (positive). The paper-powder collection voltage DCLNB in the toner removal mode is illustratively approximately −300 V (negative). The paper-powder collection voltage generating circuit 52 generates the paper-powder collection voltage DCLNB in accordance with a PWM signal from a PWM port PWM2 of the CPU 60. The paper-powder collection voltage DCLNB is then applied through a circuit-board terminal J2, a voltage line L2, a holder terminal P2, and a unit terminal UT2 to the paper-powder collection roller 45.

The drum-cleaning-voltage generating circuit 53 generates a drum cleaning voltage DCLNA to be applied to the drum cleaning roller 44. The drum cleaning voltage DCLNA in the paper-powder removal mode is illustratively approximately 600 V (positive). The drum cleaning voltage DCLNA in the toner removal mode is illustratively approximately −400 V (negative). The drum-cleaning-voltage generating circuit 53 generates the drum cleaning voltage DCLNA in accordance with a PWM signal from a PWM port PWM3 of the CPU 60. The drum cleaning voltage DCLNA is then applied through a circuit-board terminal J3, a voltage line L3, a holder terminal P3, and a unit terminal UT3 to the drum cleaning roller 44.

The transfer-voltage generating circuit 54 generates the transfer voltage TRCC to be applied to the transfer roller 33. The transfer voltage TRCC is illustratively approximately −7 kV (negative). The transfer-voltage generating circuit 54 generates the transfer voltage TRCC in accordance with a PWM signal from a PWM port PWM4 of the CPU 60. The transfer voltage TRCC is then applied through a circuit-board terminal J4, a voltage line L4, a holder terminal P4, and a unit terminal UT4 to the transfer roller 33. Note that the transfer-voltage generating circuit 54 may also have a function to generate a positive transfer voltage TRCC for removing the residual toner on the photosensitive drum 42 such that the positive transfer voltage TRCC is applied to the transfer roller 33. In this case, the transfer-voltage generating circuit 54 will generate the positive and negative transfer voltages TRCC.

The developing-voltage generating circuit 55 generates a developing voltage DEV to be applied to the developing roller 47. The developing voltage DEV is illustratively approximately from 400 to 550 V (positive). The developing-voltage generating circuit 55 generates the developing voltage DEV in accordance with a PWM signal from a PWM port PWM5 of the CPU 60. The developing voltage DEV is then applied through a circuit-board terminal J5, a voltage line L5, a holder terminal P5, and a unit terminal UT5 to the developing roller 47. Note that the developing voltage DEV may be generated by dividing the charging voltage CHG using a shunt circuit.

The belt-cleaning-voltage generating circuit 56 generates a belt cleaning voltage BCLNA to be applied to the belt cleaning roller 21. The belt cleaning voltage BCLNA is illustratively approximately −1200 V (negative). The belt-cleaning-voltage generating circuit 56 generates the belt cleaning voltage BCLNA in accordance with a PWM signal from a PWM port PWM6 of the CPU 60. The belt cleaning voltage BCLNA is then applied through a circuit-board terminal J6, a voltage applying line L6, a holder terminal P6, and a unit terminal UT6 to the belt cleaning roller 21. Note that the belt cleaning voltage BCLNA may be generated by dividing a waste collection voltage BCLNB (described next) using a shunt circuit.

The waste-collection-voltage generating circuit 57 generates the waste collection voltage BCLNB to be applied to the waste collection roller 22. The waste collection voltage BCLNB is illustratively approximately −1600 V (negative). The waste-collection-voltage generating circuit 57 generates the waste collection voltage BCLNB in accordance with a PWM signal from a PWM port PWM7 of the CPU 60. The waste collection voltage BCLNB is then applied through a circuit-board terminal J7, a voltage line L7, a holder terminal P7, and a unit terminal UT7 to the waste collection roller 22.

The holder terminals P1, P1A, P2, P3, and P5 are terminals of the holder 48K for the process unit 40K. The holder terminal P4 is a terminal of the holder 38 for the conveying mechanism 7. The holder terminals P6 and P7 are terminals of the holder 28K for the belt cleaning mechanism 20.

The unit terminals UT1, UT1A, UT2, UT3, and UT5 are terminals of the process unit 40K. Upon attachment of the process unit 40K to the holder 48K, the unit terminals UT1, UT1A, UT2, UT3, and UT5 are opposed to, and are in contact with, the holder terminals P1, P1A, P2, P3, and P5, respectively. Likewise, the unit terminal UT4 is a terminal of the conveying mechanism 7. The unit terminal UT4 is to be opposed to, and be in contact with, the holder terminal P4. The unit terminals UT6 and UT7 are terminals of the belt cleaning mechanism 20. The unit terminals UT6 and UT7 are to be opposed to, and be in contact with, the holder terminals P6 and P7.

The voltage lines L1 to L7 connect the circuit-board terminals J1 to J7 of the high-voltage power unit 50 (or, specifically, of the circuit board whereon the high-voltage power unit 50 is to be mounted) to the holder terminals P1 to P7, respectively.

3. Connection Test by Using Test Tool

Next, referring to FIGS. 3 through 5, the method for testing by using a test tool whether the high voltage generated by the high-voltage power unit 50 is to be normally applied through the dedicated voltage line to the predetermined holder terminal will be described. Configurations identical with the above-described configurations will hereinafter be designated by the identical characters, while the explanation will be omitted.

Outline of the test of this illustrative aspect is as follows. First, under control of the CPU 60, a first voltage generating circuit generates a test voltage Vts. The first voltage generating circuit is one of the plurality of voltage generating circuits 51 to 57. Next, the test voltage Vts is applied through a first voltage line, a test tool 100, and a second voltage line to a second voltage generating circuit. The second voltage generating circuit is different from the first voltage generating circuit. The first voltage line corresponds to the first voltage generating circuit. The second voltage line corresponds to the second voltage generating circuit. Finally, upon the detection current corresponding to the applied test voltage Vts and detected by the current detecting section being equal to or greater than a predetermined value, the CPU 60 decides that the predetermined voltages are to be normally applied through the respective first and second voltage lines to the attachment unit (the unit terminal).

FIRST EXAMPLE

Next, a first example of the connection test of this embodiment will be described. In this example: the drum-cleaning-voltage generating circuit 53 and the transfer-voltage generating circuit 54 are the first and second voltage generating circuits, respectively; the first voltage generating circuit outputs the positive voltage; the second voltage generating circuit outputs the negative voltage; and the second voltage generating circuit has the current detecting section.

3-1. Configuration of Electrical Connection

Figure 3:
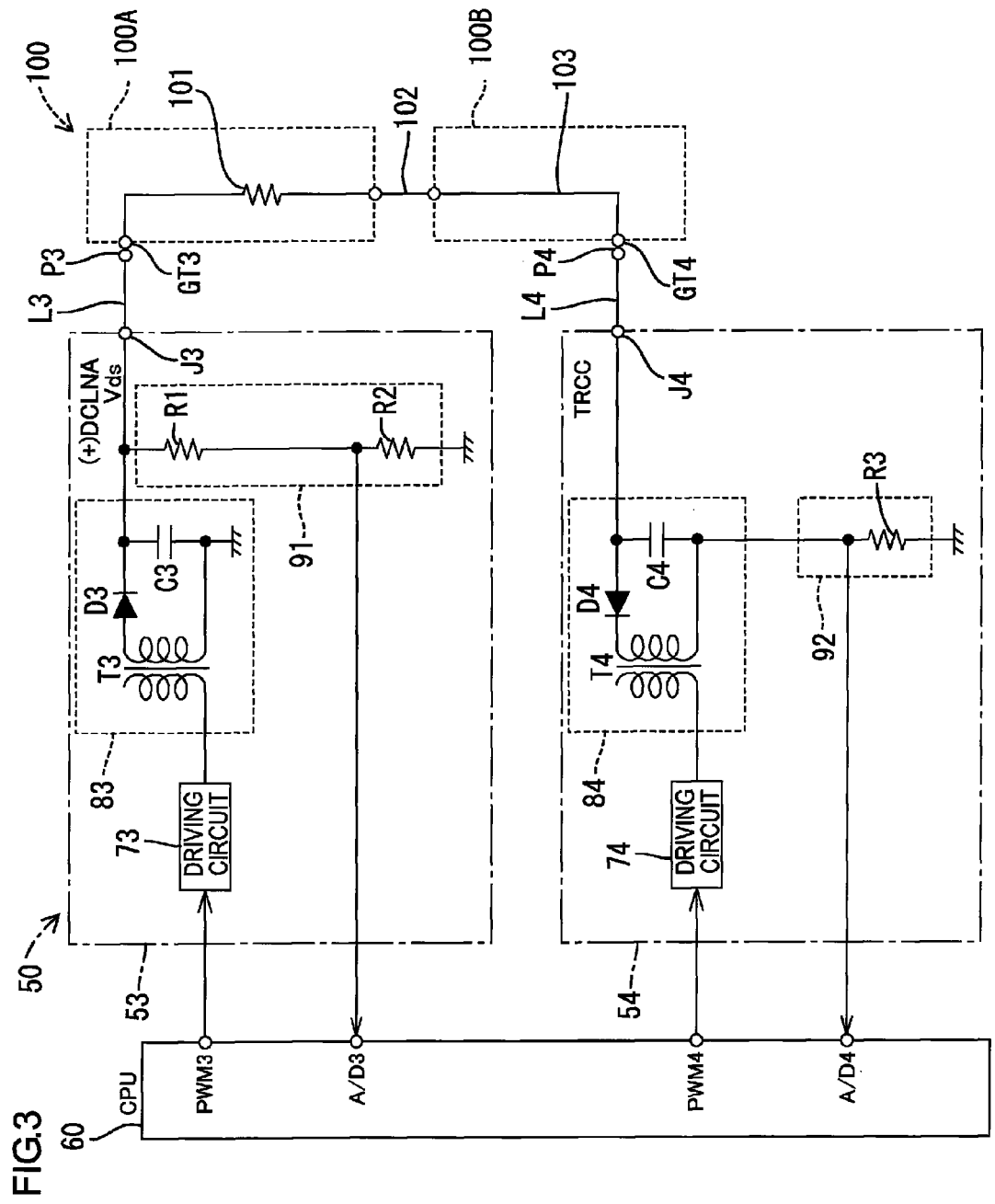
FIG. 3 is a schematic wiring diagram of connection test example 1.
Figure 4:
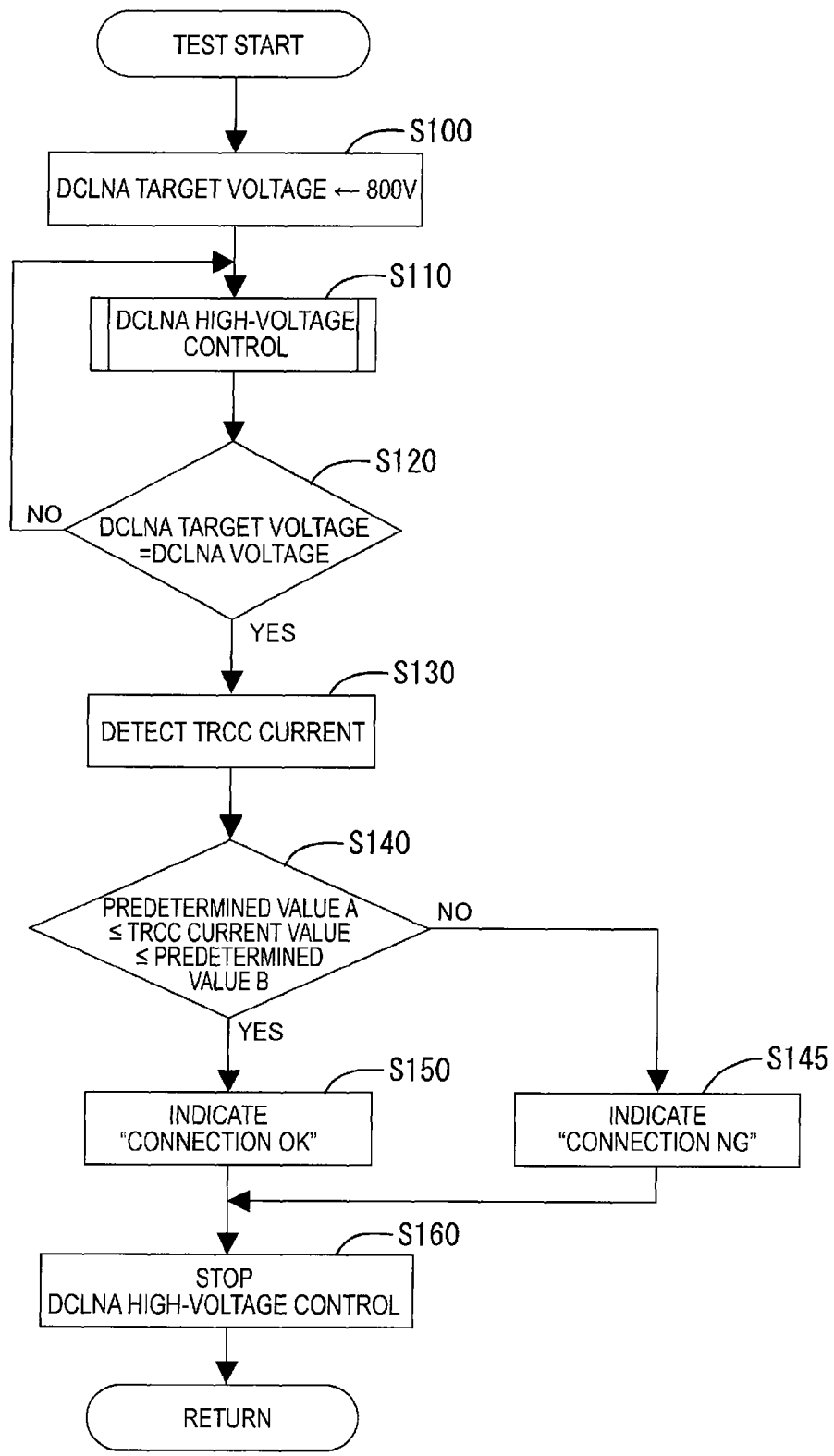
FIG. 4 is a flowchart outlining a test process of the example 1.

As illustrated in FIGS. 3 and 4, the CPU 60 executes the connection test process of this example illustratively in accordance with the processing programs stored in the ROM 61.

As illustrated in FIG. 3, the drum-cleaning-voltage generating circuit 53 illustratively includes a driving circuit 73, a high-voltage generating section 83, and a voltage detecting circuit 91 (the voltage detecting section). The high-voltage generating section 83 illustratively includes a transformer T3, a diode D3, and a capacitor C3. The driving circuit 73 drives the primary side of the transformer T1 in accordance with the PWM signal from the PWM port 3 of the CPU 60 so that the predetermined drum cleaning voltage DCLNA (positive) is generated at the secondary side of the transformer T3.

The voltage detecting circuit 91 illustratively includes dividing resistors R1 and R2. The voltage detecting circuit 91 divides the drum cleaning voltage DCLNA (the output voltage) at a predetermined ratio to detect the drum cleaning voltage DCLNA. The detection voltage is supplied to an A/D port A/D3 of the CPU 60 and is converted into a digital signal.

On the other hand, the transfer-voltage generating circuit 54 illustratively includes a driving circuit 74, a high-voltage generating section 84, and a current detecting circuit 92 (the current detecting section). Similar to the high-voltage generating unit 83, the high-voltage generating section 84 illustratively includes a transformer T4, a diode D4, and a capacitor C4. Similar to the driving circuit 73, the driving circuit 74 drives the primary side of the transformer T4 in accordance with the PWM signal from the PWM port 4 of the CPU 60 so that the predetermined transfer voltage TRCC (negative) is generated at the primary side of the transformer T4.

The current detecting circuit 92 illustratively includes a detection resistor R3. Using the voltage detected by the detection resistor R3, the current detecting circuit 92 detects the transfer current that flows through the transfer roller 33 due to the applied transfer voltage TRCC. The detection voltage of the current detecting circuit 92 is supplied to an A/D port 4 of the CPU 60 and is converted into a digital signal.

The test tool 100 includes a first test tool 100A and a second test tool 100B. The first test tool 100A and the second test tool 100B are connected together with, for example, a predetermined connection cable 102. The first test tool 100A has a tool terminal GT3. Upon illustrative attachment of the first test tool 100A to the holder 48K corresponding to the process unit 40K, the tool terminal GT3 is opposed to, and is in contact with, the holder terminal P3. The first test tool 100A has a resistor 101 that is connected between the tool terminal GT3 and the connection cable 102. The resistor 101 has a predetermined resistance.

The second test tool 100B has a tool terminal GT4. Upon illustrative attachment of the second test tool 100B to the holder 38 corresponding to the conveying mechanism 7, the tool terminal GT4 is opposed to, and is in contact with, the holder terminal P4. The second test tool 100B has a jumper line 103. The jumper line 103 connects the tool terminal GT4 and the connection cable 102 inside the second test tool 100B.

Thus, upon attachment of the first test tool 100A to the holder 48K and upon attachment of the second test tool 100B to the holder 38, the output part (the circuit-board terminal J3) of the drum-cleaning-voltage generating circuit 53 and the output part (the circuit-board terminal J4) of the transfer-voltage generating circuit 54 are connected together through the resistor 101. While the first test tool 100A and the second test tool 100B are connected together by the connection cable 102 in this example, the first test tool 100A and the second test tool 100B may be a single integral test tool.

3-2. Connection Test

In the state where the test tool 100 is attached to the holders 48K, 38 as described above, and on receipt of an instruction for test process execution from the test operator through an operation unit (not illustrated in the drawings) of the printer 1, the CPU 60 sets a target voltage of the drum cleaning voltage DCLNA to 800 V (step S100 in FIG. 4) as the test voltage Vts. Next, the CPU 60 controls the duty ratio of the PWM signal so that the drum cleaning voltage DCLNA (the test voltage Vts) becomes the target voltage 800 V (step S110). Note that, during the connection test, the voltage generating operation of the transfer-voltage generating circuit 54 is stopped.

The test voltage Vts is subjected to constant voltage control according to the detection result of the voltage detecting circuit 91. Note that the voltage detecting circuit 91 and the constant voltage control do not have to be necessarily provided. For example, in a case where a value of the duty ratio (the control voltage) of the PWM signal is proved to result in a predetermined value of the generated voltage of the voltage generating circuit, the voltage detecting circuit and the constant voltage control are unnecessary.

If the test voltage Vts has become the target voltage 800 V (step S120: YES), the CPU 60 detects the current (a TRCC current) flowing through the transfer-voltage generating circuit 54 on a basis of the detection result of the current detecting circuit 92 of the transfer-voltage generating circuit 54. If the TRCC current is equal to or greater than a predetermined value A (a first predetermined value) and is equal to or smaller than a predetermined value B (a second predetermined value) (S140: YES), the CPU 60 decides that the predetermined voltages (the drum cleaning voltage DCLNA and the transfer voltage TRCC) are to be normally applied through the respective voltage lines L3 (the first voltage line) and L4 (the second voltage line) to the respective attachment units (the unit terminals UT3 and UT4).

The base of the above decision is as follows: if the detection current in the transfer-voltage generating circuit 54 due to the test voltage Vts applied from the drum-cleaning-voltage generating circuit 53 to the transfer-voltage generating circuit 54 is equal to or greater than the predetermined value A and is equal to or smaller than the predetermined value B, the electrical path through the circuit-board terminal J3, the voltage line L3, the holder terminal P3, the test tool 100, the holder terminal P4, the voltage line L4, and the circuit-board terminal J4 is decided to have been normally established.

Then, the CPU 60 indicates the decision ("Connection is OK") in an display panel to notify the test operator (S150) and stops generating the test voltage Vts.

On the other hand, in step S140, if the detection TRCC current is determined not to be equal to or greater than the predetermined value A and not be equal to or smaller than the predetermined value B, i.e. if the detection TRCC current is smaller than the predetermined value A or is greater than the predetermined value B, the CPU 60 decides that the connection of the above electrical path is anormal.

The base of the above decision is as follows: if the detection TRCC current is smaller than the predetermined value A, bad connection at the terminal portion, leakage in the above electrical path (excepting the test tool 100; the same shall apply hereinafter), etc. are conceivable. Particularly, if the detection TRCC current is zero, breaking of the wire elsewhere in the electrical path is conceivable. On the other hand, if the detected TRCC current exceeds the predetermined value B, a short-circuiting in the electrical path is conceivable. In other words, in step 140, the CPU 60 determines the connection of the electrical path and, further, short-circuiting.

Thereafter, the CPU 60 indicates it ("Connection is NG") in, for example, the display panel to notify the test operator (S145), and stops generating the test voltage Vts by the drum-cleaning-voltage generating circuit 53. Note here that the predetermined value A and the predetermined value B, which is greater than the predetermined value A, have been determined in advance by experiments etc. as values whereby normal and anormal of the test electrical path can be decided.

The condition for deciding that "Connection is OK" may be without the "the TRCC current is equal to or smaller than the predetermined value". In other words, the condition for deciding that "Connection is OK" may be simply "if the TRCC current is equal to or greater than the predetermined value A". Also in this case, at least breaking of the wire and bad connection in the electrical path can be detected.

SECOND EXAMPLE

Next, a second example will be described. In this example, a drum-cleaning-voltage generating circuit 53A and the charging-voltage generating circuit 51 are the first and second voltage generating circuits, respectively; the first voltage generating circuit outputs the negative voltage; the second voltage generating circuit outputs the positive voltage; and the first voltage generating circuit has the current detecting section.

3-3. Electrical Configuration

Figure 5:
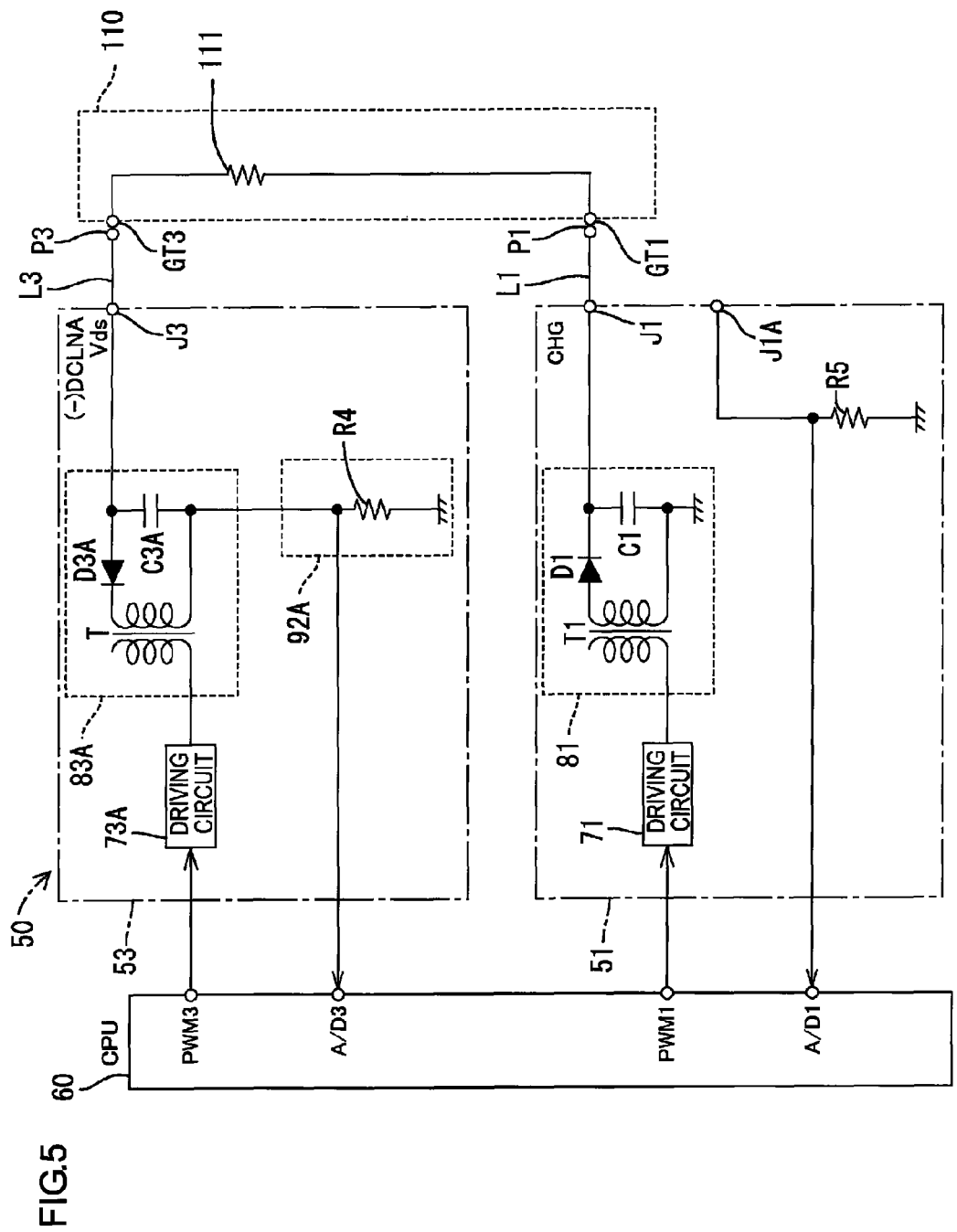
FIG. 5 is a schematic wiring diagram of connection test example 2.

As illustrated in FIG. 5, unlike the first example, the drum-cleaning-voltage generating circuit 53A of this example generates a negative high voltage. The drum-cleaning-voltage generating circuit 53A illustratively includes a driving circuit 73A, a high-voltage generating section 83A, and a current detecting circuit 92A. The high-voltage generating section 83A illustratively includes a transformer T3A, a diode D3A, and a capacitor C3A. The driving circuit 73A drives the primary side of the transformer T3A in accordance with the PWM signal from the PWM port PWM3 of the CPU 60 so that the predetermined drum cleaning voltage DCLNA (negative) is generated at the secondary side of the transformer T3A. The current detecting circuit 92A includes a detection resistor R4. Using the voltage detected by the detection resistor R4, the current detecting circuit 92A detects the current flowing through the drum cleaning roller 44 due to the applied drum cleaning voltage DCLNA. The detection voltage of the current detecting circuit 92A is supplied to the A/D port A/D3 of the CPU 60 and is converted into a digital signal.

On the other hand, the charging-voltage generating circuit 51 illustratively includes a driving circuit 71, a high-voltage generating section 81, and a grid voltage detection resistor R5. The high-voltage generating section 81 illustratively includes a transformer T1, a diode D1, and a capacitor C1. The driving circuit 71 drives the primary side of the transformer T1 in accordance with the PWM signal from the PWM port PWM1 of the CPU 60 so that the predetermined charging voltage TRCC (positive) is generated at the secondary side of the transformer T1.

A test tool 110 illustratively has a tool terminal GT1. Upon illustrative attachment of the test tool 110 to the holder 48K corresponding to the process unit 40K, the tool terminal GT1 is opposed to, and is in contact with, the holder terminal P1. The test tool 110 also has a resistor 111 that is connected between the tool terminal GT1 and the tool terminal GT3. The resistor 111 has a predetermined resistance.

Upon attachment of the test tool 110 to the holder 48K, the output part (the circuit-board terminal J3) of the drum-cleaning-voltage generating circuit 53A and the output part (the circuit-board terminal J1) of the charging-voltage generating circuit 51 are connected together through the resistor 111.

3-4. Connection Test

In a state where the test tool is attached to the holder 48K, and on receipt of an instruction for test process execution from the test operator, the CPU 60 sets the target voltage of the drum cleaning voltage DCLNA illustratively at −300 V as the test voltage Vts. Next, the CPU 60 controls the duty ratio of the PWM signal so that the drum cleaning voltage DCLNA becomes the target voltage −300 V.

If the test voltage Vts has become the target voltage −300 V (step S120: YES), the CPU 60 detects the current (a CHG current) flowing through the charging-voltage generating circuit 51 on a basis of the detection result of the current detecting circuit 92A of the drum-cleaning-voltage generating circuit 53A. In this case, the current due to the applied test voltage Vts flows mainly through the electrical path including the secondary winding of the transformer T3A of the drum-cleaning-voltage generating circuit 53A, the resistor R4, the secondary winding of the transformer T1 of the charging-voltage generating circuit 51, the diode D1, the test tool 110, and the diode D3A.

Based on the CHG current, and similar to the first example, the CPU 60 decides whether the predetermined voltages (the drum cleaning voltage DCLNA and the charging voltage CHG) are to be normally applied through the respective voltage lines L3 (the first voltage line) and L1 (the second voltage line) to the respective attachment units (the unit terminals UT3 and UT1). Then, the CPU 60 performs the process based on the decision result (see steps S120 to S160 in FIG. 4).

4. Effects of Illustrative Aspect

Only by using the test tool 100 (110) and the current detecting section 92 (92A) that is already existing in the voltage generating circuit 54 (53A), the connection test can be easily performed for the two voltage lines L3 and L4 (L3 and L1).

Furthermore, because the connection is tested by coupling the first voltage generating circuit 53 (53A) and the second voltage generating circuit 54 (51) that generate the respective predetermined voltages having different polarities from each other, the current can be suitably detected using the current detecting section 92 (92A). Specifically, because the smoothing diode D3 (D3A) of the first voltage generating circuit and the smoothing diode D4 (D1) of the second voltage generating circuit are connected in opposite directions to each other, the detection current flows through the smoothing diode D3 (D4) or through the smoothing diode D3A (D1). Therefore, the current can be suitably detected using the current detecting section 92 (92A).

Furthermore, the rated voltage of the first voltage generating circuit 53 (53A) is smaller than the rated voltage of the second voltage generating circuit 54 (51). Accordingly, even if the test voltage by the first voltage generating circuit 53 (53A) becomes maximum during the test, the second voltage generating circuit 54 (51) and the current detecting section 92 (92A) are prevented from damage. Note that the "rated voltage" represents an absolute value voltage.

Furthermore, in the drum-cleaning-voltage generating circuit 53 (the first voltage generating circuit) of the first example, the test voltage Vts is subjected to constant voltage control. This makes it possible to improve reliability of the decision using the detection current due to the applied test voltage Vts whether the connection is good or bad. In other words, the reliability of the voltage line test can be improved.

Furthermore, the CPU 60 applies the test voltage Vts to the second voltage generating circuit 54 (51) through the test tool 100 (110) including the resistor 101 (111) having the predetermined resistance. Therefore, by suitably changing the value of the resistor 101 (111) and thereby suitably setting the load of the first voltage generating circuit 53 (53A) at the time of the test, the first voltage generating circuit 53 (53A) can be prevented from overload during the test.

<Other Illustrative Aspects>

The present invention is not limited to the above description with reference to the drawings. For example, following illustrative aspects are also included within the scope of the present invention.

(1) In the above illustrative aspect, the first and second voltage generating circuits, which generate the respective predetermined voltages illustratively having opposite polarities from each other, are coupled. The present invention is not limited to this. The first and second voltage generating circuits which generate predetermined voltages having the same polarity may be coupled. In this case, only a path that carries the current due to the test voltage without passing through the smoothing diodes will have to be provided.

(2) In the above illustrative aspect, the test tool 100 (110) having the resistor 101 (111) is illustratively used. The present invention is not limited to this. In a case where none of the voltage generating circuits is overloaded during the test, a test tool having no resistor, i.e. a test tool having a jumper line alone, may be used.

(3) Selection of the first and second voltage generating circuits out of the plurality of voltage generating circuits 51 to 57 is not limited to the selections of the first example and the second example. For example, the drum-cleaning-voltage generating circuit 53 and the belt-cleaning-voltage generating circuit 56 may be selected as the first and second voltage generating circuits, respectively.

(4) Each voltage generating circuit may have any configuration. It is only necessary for the voltage generating circuit to have a configuration for detecting the predetermined test current due to the test voltage by the first voltage generating circuit, by using the current detecting section in at least one of the first and second voltage generating circuits.

What is claimed is:

1. An image forming apparatus comprising:
an attachment unit configured to receive at least one voltage;
a holder configured to allow the attachment unit to be removably attached thereto, the attachment unit being replaceable with a test tool;
a plurality of voltage generating circuits, each of the voltage generating circuits being configured to generate a predetermined voltage and to apply the predetermined voltage through a corresponding voltage line to the attachment unit attached to the holder;
a controller for controlling operation of the plurality of voltage generating circuits, the controller being configured to control a first voltage generating circuit to generate a test voltage and apply the test voltage through a first voltage line, the test tool, and a second voltage line to a second voltage generating circuit in which a voltage generating operation is stopped, the first voltage generating circuit being one of the plurality of voltage generating circuits, the first voltage line corresponding to the first voltage generating circuit, the second voltage generating circuit being different from the first voltage generating circuit, and the second voltage line corresponding to the second voltage generating circuit;
a current detecting section provided in at least one of the first and second voltage generating circuits, the current detecting section being configured to detect a current flowing through the attachment unit due to the applied predetermined voltage; and
a deciding section configured to, upon the detection current corresponding to the applied test voltage and detected by the current detecting section as being equal to or greater than a first predetermined value, decide that the predetermined voltages are to be normally applied through the respective first and second voltage lines to the attachment unit.

2. The apparatus according to claim 1, wherein:
upon the detection current being equal to or greater than the first predetermined value and being equal to or smaller than a second predetermined value, the second predetermined value being greater than the first predetermined value, the deciding section decides that the predetermined voltages are to be normally applied through the respective first and second voltage lines to the attachment unit.

3. The apparatus according to claim 1, wherein:
the first and second voltage generating circuits generate the respective predetermined voltages having polarities opposite to each other.

4. The apparatus according to claim 1, wherein:
an absolute value of a rated voltage of the first voltage generating circuit is smaller than an absolute value of a rated voltage of the second voltage generating circuit.

5. The apparatus according to claim 1, wherein:
the first voltage generating circuit includes a voltage detecting section for detecting the predetermined voltage; and
the test voltage is subjected to constant voltage control in accordance with the detection result of the voltage detecting section.

6. The apparatus according to claim 1, wherein:
the controller applies the test voltage to the second voltage generating circuit through the test tool; and
the test tool includes a resistor having a predetermined resistance.

7. The apparatus according to claim 1, wherein:
the holder includes first and second holders corresponding to the first and second voltage generating circuits, respectively; and
the attachment unit includes first and second attachment units corresponding to the first and second holders, respectively.

8. A method for testing an image forming apparatus, the image forming apparatus including:
a holder configured to allow an attachment unit to be removably attached thereto, the attachment unit being configured to receive at least one voltage, the attachment unit being replaceable with a test tool; and
a plurality of voltage generating circuits, each of the voltage generating circuits being configured to generate a predetermined voltage and to apply the predetermined voltage through a corresponding voltage line to the attachment unit attached to the holder;
the method being for testing whether the voltages are to be normally applied through the voltage lines to the attachment unit, the method comprising the steps of:
a) attaching the test tool to the holder;
b) generating a test voltage using a first voltage generating circuit, the first voltage generating circuit being one of the plurality of voltage generating circuits;

c) applying the test voltage through a first voltage line, the test tool, and a second voltage line to a second voltage generating circuit in which a voltage generating operation is stopped, the first voltage line corresponding to the first voltage generating circuit, the second voltage generating circuit being different from the first voltage generating circuit, and the second voltage line corresponding to the second voltage generating circuit;

d) detecting a current due to the applied test voltage;

e) determining whether the detected current in the step d) is equal to or greater than a first predetermined value; and f) upon determination that the detected current is greater than the first predetermined value in the step e), deciding that the predetermined voltages are to be normally applied through the first and second voltage lines to the attachment unit.

9. The method according to claim 8, wherein:

the step f) includes, upon determination that the detected current is equal to or greater than the first predetermined value and is equal to or smaller than a second predetermined value in the step e), deciding that the predetermined voltages are normally applied through the respective first and second voltage lines to the attachment unit, the second predetermined value being greater than the first predetermined value.

10. The method according to claim 8, wherein:

the first and second voltage generating circuits generate the respective predetermined voltages having polarities opposite to each other.

11. The method according to claim 8, wherein:

an absolute value of a rated voltage of the first voltage generating circuit is smaller than an absolute value of a rated voltage of the second voltage generating circuit.

12. The method according to claim 8, wherein:

the first voltage generating circuit includes a voltage detecting section for detecting the predetermined voltage and the step b) includes performing constant voltage control of the test voltage in accordance with the detection result.

13. The method according to claim 8, wherein:

the step c) includes applying the test voltage through a resistor in the test tool, the resistor having a predetermined resistance.

* * * * *